United States Patent [19]

Smith

[11] Patent Number: 5,533,154
[45] Date of Patent: Jul. 2, 1996

[54] OPTICAL MEMORY

[75] Inventor: Kevin Smith, Suffolk, England

[73] Assignee: British Telecommunications, plc, London, England

[21] Appl. No.: 211,792
[22] PCT Filed: Oct. 14, 1992
[86] PCT No.: PCT/GB92/01882
   § 371 Date: Jul. 13, 1994
   § 102(e) Date: Jul. 13, 1994
[87] PCT Pub. No.: WO93/08574
   PCT Pub. Date: Apr. 29, 1993

[30] Foreign Application Priority Data

Oct. 18, 1991 [GB] United Kingdom ............ 9122182

[51] Int. Cl.$^6$ .................... G02B 6/26; G02B 6/42
[52] U.S. Cl. ................... 385/27; 385/24; 385/122
[58] Field of Search ................ 385/24, 27, 31, 385/32, 122

[56] References Cited

U.S. PATENT DOCUMENTS

| | | |
|---|---|---|
| 4,468,090 | 8/1984 | Ulrich et al. . |
| 4,469,397 | 9/1984 | Shaw et al. . |
| 4,720,162 | 1/1988 | Mochizuki et al. . |
| 4,910,737 | 3/1990 | Payne et al. ............ 385/31 |
| 5,050,183 | 9/1991 | Duling, III . |
| 5,134,621 | 7/1992 | Marshall ................ 372/8 |
| 5,307,428 | 4/1994 | Blow et al. ............ 385/31 |
| 5,479,291 | 12/1995 | Smith et al. ........... 385/31 |

OTHER PUBLICATIONS

"All Optical Gbit/s Switching Using Nonlinear Optical Loop Mirror", Nelson et al., Electronic Letters, Apr. 25, 1991, vol. 27, No. 9, pp. 704–705.

"Experimental Demonstration of Optical Soliton Switching in an All–fiber Nonlinear Sagnac Interferometer", Blow et al., 1989 Optical Letters, vol. 14, No. 14, Jul. 15, 1989, pp. 754–756.

"Optical Fiber Switch Employing a Sagnac Interferometer", Farries, et al., Appl. Phys. Lett. 55(1), Jul. 3, 1989, pp. 25–26.

Primary Examiner—Rodney B. Bovernick
Assistant Examiner—Robert E. Wise
Attorney, Agent, or Firm—Nixon & Vanderhye

[57] ABSTRACT

An optical memory for storing optical signals of a first wavelength comprises a first non-linear loop mirror switch having first and second optical ports, an optical delay line having one end coupled to one port of the first switch and its other end coupled to a reflector. The delay line includes an optical amplifier for providing gain at the first wavelength.

10 Claims, 3 Drawing Sheets

OPTICAL MEMORY

This invention relates to an optical memory.

BACKGROUND OF THE INVENTION

A major or goal of all-optical processing is speed, which requires rapid access to high capacity, relatively short term memory. An optical memory is a basic element which is essential for more complex data processing, including pattern recognition applications.

The use of a fibre loop as a recirculating delay line, that is to say as an "optical memory", has been discussed for several years and demonstrated in conjunction with optical amplifiers. The potential high storage capacity of such a configuration was first realised in the all-optical, long distance soliton transmission experiments which employed distributed Raman amplification. A known optical memory configuration is shown in FIG. 1. Its basic elements consist of a long loop (25 km in this example) of single mode fibre 2, a fibre coupler 4 having a 3 dB coupling ratio, and a single erbium-doped fibre amplifier (EDFA) 6. The fibre is chosen to be suitable for soliton propagation over ultra-long fibre distances. To this end, the fibre used is dispersion-shifted, so that the dispersion is low, and soliton supporting (D~+1 ps/nm.km) at the operating wavelength. The signal pulses to be stored are then gated, via a first gate 8, into the loop 2 via a port 10 of the coupler 4, a 120 µs pulse train just filling the 25 km long loop. As long as unity loop gain is maintained, the signal continues to circulate without decrease in pulse energy. A port 12 of the coupler 4 acts as a tap for the memory, and a second gate 14 selects the stored data after the desired time interval.

A disadvantage of this type of optical memory is that optical processing cannot be carried out on the stored data circulating in the loop, other than by gating in additional data pulses, or by erasing the memory and gating in a new stream of data pulses. It is an object of the present invention to provide an optical memory with improved optical processing capabilities.

BRIEF DESCRIPTION OF THE DRAWINGS

The present invention provides an optical memory for storing optical signals of a first wavelength, the optical memory comprising a first, non-linear loop mirror switch having first and a second optical ports, and an optical delay line having one end coupled to one port of the first non-linear loop mirror switch and its other end coupled to a reflector reflective at the first wavelength.

Non-linear optical loop mirror switches have been very successful in demonstrating non-linear optical switching in all-fibre configurations. In particular, when used in two-wavelength mode, the device can be employed as a high-speed modulator or logic gate. In this mode of operation, a strong pump wavelength is used to switch a signal of another wavelength. See K. J. Blow, N. J. Doran, B. K. Nayar and B. P Nelson; "Two-wavelength operation of the non-linear fibre loop mirror", Opt. Lett., 15, p. 248 (1990).

Figure 1:
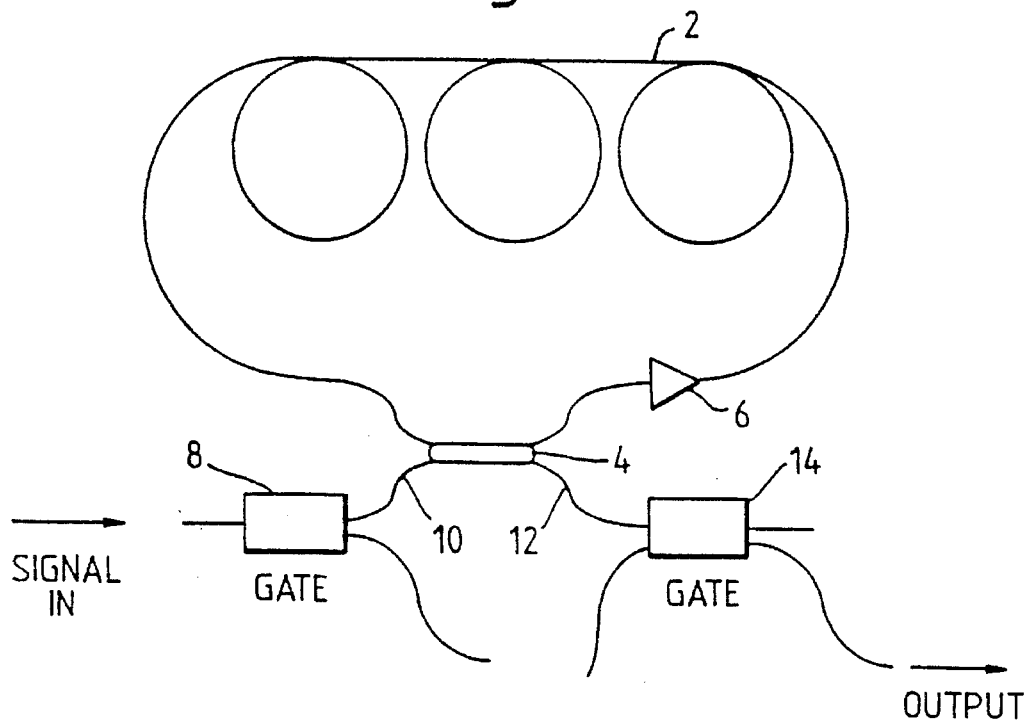

In the present invention, the first non-linear loop mirror switch is configured to be reflective to signals of the first wavelength, until the strong pump signal of appropriate intensity at a second wavelength is coupled to the loop. This permits single pulses to be inserted into, or extracted from, the delay line, thereby achieving single pulse processing.

The reflector may comprise a second non-linear loop mirror switch operable in the same manner as the first. This configuration allows both insertion and extraction of data from either end of the delay line. In particular, it may be convenient to insert data at one end of the delay line and extract data from the other end.

The delay line preferably includes an optical amplifier to provide gain at the first wavelength, since this compensates for the loss which would otherwise restrict the long term storage time. Preferably, soliton pulses are used as the data storage bits in the optical delay line. In this way, the essentially distortionless propagation properties of solitons over thousands of kilometers of total fibre path length are exploited. The storage time is, in this case, limited by the same pulse timing jitter considerations as for long haul soliton transmission systems. As an example, for a data rate of 10 GHz, a fibre length of 50 km has a storage capacity of approximately 2.5 Mbits and an access time of ~250 microseconds. By recirculating the signal pulses many times along the delay line, considerable storage times are available, for example 400 round-trips give rise to a storage time of 0.1 seconds equivalent to 20,000 km of fibre path length.

Further significant improvements, involving pulse retiming via simple modulation techniques within the delay line, should permit significantly higher capacity and storage times. Ultimately, with data rates of the order of 50 GHz, we can expect storing well over 10 Mbits for times in excess of 10 seconds.

Advantageously, the memory further comprises a respective source of optical control pulses associated with the or each non-linear loop mirror switch, the or each optical source being effective to introduce control pulses at a second wavelength to the associated non-linear loop mirror switch. Preferably, the or each optical source is connected to the associated loop mirror switch via a respective wavelength-dependent coupler, and a respective polarisation controller is associated with the or each non-linear loop mirror switch.

The invention also provides a method of storing optical signals in an optical delay line, the method comprising inputting optical signals of a first wavelength into one end of the optical delay line via a non-linear loop mirror switch, and coupling the other end of the optical delay line to a reflector reflective at the first wavelength.

Preferably, the method further comprises the step of introducing pulsed control signals of a second wavelength into the non-linear loop mirror switch, whereby optical signals at the first wavelength are transmitted into the delay line only when coincident with a control signal pulse.

BRIEF DESCRIPTION OF THE DRAWINGS

Figure 3:
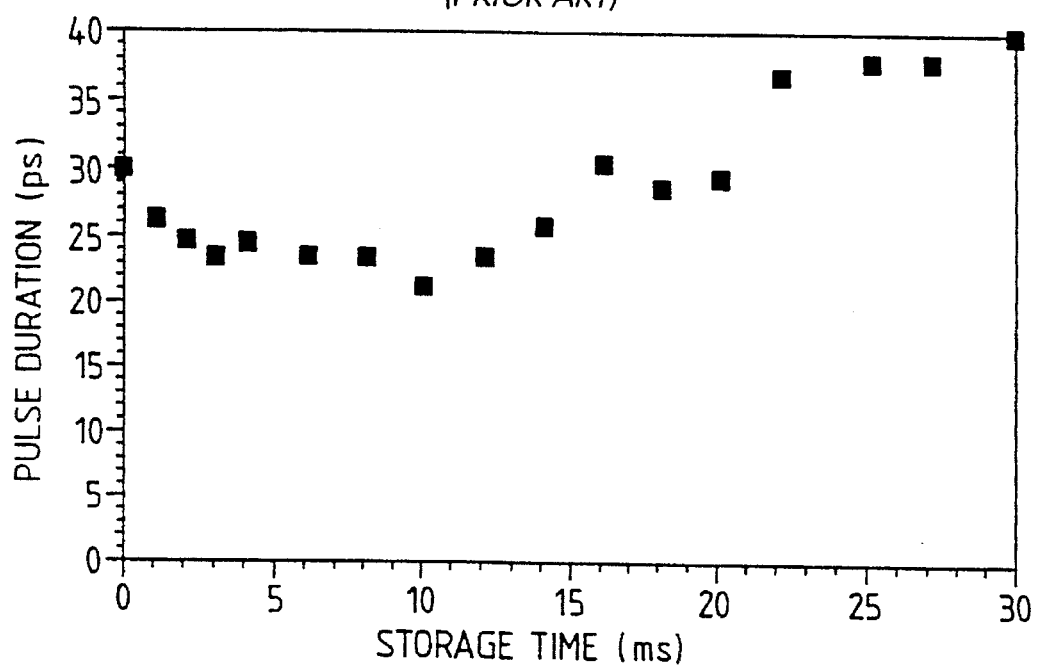
Figure 2A:
Figure 2B:
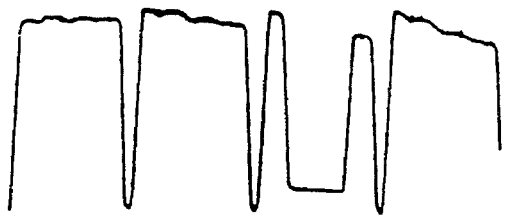
Figure 2C:
Figure 4:
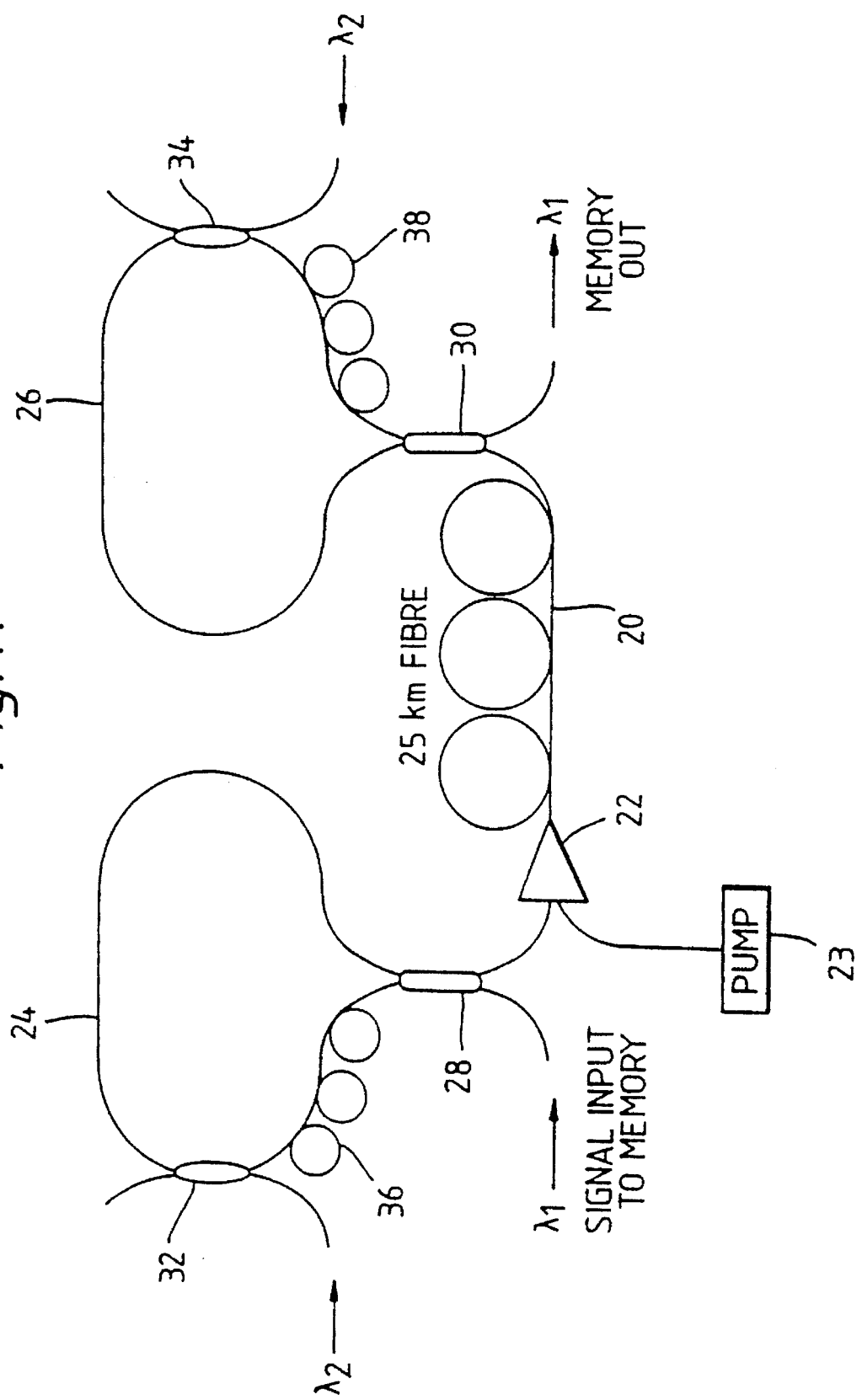

A prior art optical memory and an embodiment of the present invention will now be described, by way of example, with reference to the accompanying drawings, in which:

FIG. 1 is a schematic diagram of a prior art optical fibre loop recirculating delay line;

FIGS. 2(a) to 2(c) are graphs showing the performance of the memory of FIG.1;

FIG. 3 is a graph of the measured pulse width as a function of storage time for the memory of FIG.1; and FIG. 4 is a schematic diagram of an embodiment of the present invention.

DESCRIPTION OF THE PREFERRED EMBODIMENTS

The prior art optical memory of FIG. 1 has already been described.

The operation of the recirculating loop memory of FIG. 1 is is illustrated in FIG. 2, which shows a 120 μs pulse train circulating ~240 times for a total storage time of 30 ms (corresponding to an effective path length of 6000 km).

FIG. 2(a) shows the decay of the output of the loop 2, from the initial injection of the pulse train over 30 ms of delay to when the pump power to the loop EDFA is switched off. The limited resolution of the digital storage oscilloscope used does not reveal the individual 120 μs pulse trains.

FIG. 2(b) is a close-up of the memory output towards the end of the 30 ms delay, and clearly shows the operation of the gate 14 which, in this case, is set to select the 240th round-trip.

FIG. 2(c) shows the gated output of the memory which consists of a single ~120 μs pulse train which has been stored for 30 ms. In this case, the signal source is a mode-locked external cavity semiconductor laser providing ~30 ps duration pulses at a repetition frequency of 2.5 GHz. Amplification of the source is required (using EDFA) to ensure that pulse powers within the loop 2 are fundamental solitons (for example, for 30 ps pulses and D=+1 ps/nm.km, the soliton power at the input to the memory for a 2.5 GHz signal amounts to ~1 mW).

FIG. 3 shows the measured pulse widths as a function of the storage time for delays (effective path lengths) up to 30 ms (6000 km). At a data rate of 2.5 GHz, this is equivalent to storing ~0.3 Mbits. The observed ~30% broadening of the pulses over this fibre path length is consistent with the theoretical jitter limits imposed by amplified spontaneous emission (the Gordon-Haus limit).

The configuration shown in FIG. 4, according to the present invention, comprises a 25 km length loop of single-mode standard, silica based, telecommunications fibre 20 and a single erbium-doped fibre amplifier 22 pumped by a pump source 23, the fibre 20 and the amplifier 22 together constituting a linear fibre delay line which is coupled between two non-linear loop mirror switches 24 and 26 by fibre couplers 28 and 30, respectively. The loop mirror switches 24 and 26 are both operated in two-wavelength mode. In this case, the fibre couplers 28 and 30 each have a coupling ratio of 50:50 at the signal wavelength $\lambda_1$. Control pulses at a second wavelength $\lambda_2$ are introduced into the loop mirror switches 24 and 26 via separate wavelength-dependent fibre couplers 32 and 34. The couplers 32 and 34 are spliced into their respective loop mirror switches 24 and 26, and both are set up in reflecting mode through adjustment of respective polarisation controllers 36 and 38. Incoming data (signal pulses) then is only transmitted through and into the delay line 20, 22 when a control pulse is coincident with it. It should be noted that the loop mirror switch 24 can also be used to modulate or encode the incoming data for storage in the delay line 20, 22. The signal is gated into the delay line 20, 22 for a time up to the round-trip time of the delay fibre, by gating the pump pulses. When the data has been admitted to the delay line 20, 22, multiple pass circulation is achieved between the loop mirror switches 24 and 26. Ultimately, stored data is degraded through pulse broadening and jitter effects which accumulate over the thousands of kilometers of effective path length propagation. In the configuration of FIG. 4 this may limit the total storage time of the device to durations on the order of hundreds of milliseconds.

In order to extract data from the delay line 20, 22 after the required storage time has elapsed, either of the loop mirror switches 24 and 26 can be used, the timing sequence of these events and the pulse propagation characteristics being as for the FIG. 1 arrangement and as described above with reference to FIGS. 2 to 3.

The present invention, therefore, combines the two processing functions of memory and non-linear switching. The basic architecture permits the memory to be addressed and updated directly via the ultrafast loop mirror switches 24 and 26.

As noted previously, the accumulated effects of amplified spontaneous emission, and the associated timing jitter, tend to limit the storage time of the memory. However, this memory degradation may be suppressed by the use of modulation techniques within the optical delay line. The action of the modulation is to provide a fixed timing slot for each bit of information. With these techniques, one can anticipate storing data rates well into the tens of Gbits range (giving a memory capacity of >10 Mbits) for times of the other of 10 seconds.

The pump 23 for the amplifier 22 can be switched off intermittently to prevent lasing within the cavity defined by the loop mirrors switches 24 and 26, or to erase the contents of the delay line 20,22.

I claim:

1. An optical memory for storing optical signals of a first wavelength, the optical memory comprising a first, non-linear loop mirror switch having first and second optical ports, and an optical delay line having one end coupled to one port of the first non-linear loop mirror switch and its other end coupled to a reflector reflective at the first wavelength and operable to reflect signals of the first wavelength received via the delay line back into the delay line.

2. A memory as claimed in claim 1, in which the reflector is a second, non-linear loop mirror switch.

3. A memory as claimed in claim 1, in which the delay line includes an optical amplifier for providing gain at the first wavelength.

4. A memory as claimed in claim 3, in which the amplifier comprises an optical fibre amplifier.

5. A memory as claimed in claim 1, in which the first loop mirror switch, the reflector and the delay line are all formed from optical fibre waveguides.

6. A memory as claimed in claim 1, further comprising a respective source of optical control pulses associated with the or each non-linear loop mirror switch, the or each optical source being effective to introduce control pulses at a second wavelength to the associated non-linear loop mirror switch.

7. A memory as claimed in claim 6, wherein the or each optical source is connected to the associated loop mirror switch via a respective wavelength-dependent coupler.

8. A memory as claimed in claim 6, wherein a respective polarisation controller is associated with the or each non-linear loop mirror switch.

9. A method of storing optical signals in an optical delay line, the method comprising inputting optical signals of a first wavelength into one end of the optical delay line via a non-linear loop mirror switch, and coupling the other end of the optical delay line to a reflector reflective at the first wavelength, which reflector reflects signals of the first wavelength received from said delay line back into the delay line.

10. A method as claimed in claim 9, further comprising the step of introducing pulsed control signals of a second wavelength into the non-linear loop mirror switch, whereby optical signals at the first wavelength are transmitted into the delay line only when coincident with a control signal pulse.

* * * * *